United States Patent [19]

Awaji

[11] 4,412,135
[45] Oct. 25, 1983

[54] PHOTO COUPLER DEVICE MOLDING INCLUDING FILLER PARTICLES

[75] Inventor: Hidekazu Awaji, Kashihara, Japan

[73] Assignee: Sharp Kabushiki Kaisha, Osaka, Japan

[21] Appl. No.: 383,330

[22] Filed: May 28, 1982

Related U.S. Application Data

[63] Continuation of Ser. No. 132,794, Mar. 21, 1980, abandoned.

[30] Foreign Application Priority Data

Mar. 23, 1979 [JP] Japan .............................. 54-38674[U]
May 25, 1979 [JP] Japan .................................. 54-65379

[51] Int. Cl.$^3$ ............................................. G02B 27/00
[52] U.S. Cl. ..................................... 250/551; 250/227
[58] Field of Search ............... 250/551, 239, 216, 227; 357/19; 350/96.15; 455/602

[56] References Cited

U.S. PATENT DOCUMENTS 4,095,116 6/1978 Felkel et al. ........................... 357/19
4,112,308 9/1978 Olschewski et al. ................. 250/551
4,237,382 12/1980 Thillays ................................ 250/551

Primary Examiner—David C. Nelms
Attorney, Agent, or Firm—Birch, Stewart, Kolasch & Birch

[57] ABSTRACT

A photo coupler device comprises only one layer having a resin material and addition particles provided for molding a pair of a light emitting element and a light receiving element. The addition particles are made of one from silica of crystal form or amorphous form, glass fibre and the like. The addition particles are suspended in the layer in a certain proportion equal to or below about 70% by weight in comparison with the weight of the resin material. A diameter of the addition particles is in the range of about several tens to about one hundred $\mu$m. Preferably, the resin material is made of epoxy resin having phenol as a hardener in the case where the light emitting element provides its electroluminescence of infrared region. In another form of the present invention, an additional layer also having another type of resin material and the addition particles can be formed to mold the first layer containing the pair of the elements.

15 Claims, 4 Drawing Figures

PHOTO COUPLER DEVICE MOLDING INCLUDING FILLER PARTICLES

This application is a continuation of copending application Ser. No. 132,794, filed on Mar. 21, 1980, now abandoned.

BACKGROUND OF THE INVENTION

The present invention relates to a photo coupler and, more particularly, to photo coupler mold techniques.

The conventional photo coupler mold techniques require that a light transmitting layer, have as a pair of elements a light emitting element and a light responsive element, and an opaque layer is provided to mold the pair of elements together. The light transmitting layer is provided for positioning the pair and allowing light transmittance between them. The opaque layer is formed for preventing the introduction of moisture and external radiation from the surroundings to the pair of elements. At least two distinct mold layers were formed using the conventional photo coupler mold techniques, thus resulting in making the fabricating steps complicated. Moreover, since an interface between the two distinct mold layers was close to the pair of light emitting and light responsive elements, an electric discharge tended to develop through the interface upon the application of high electrical energy to the pair of elements.

SUMMARY OF THE INVENTION

Accordingly, it is the primary object of the present invention to provide an improved photo coupler device which is molded with any suitable synthetic resin.

It is a further object of the present invention to provide an improved photo coupler device which is molded by utilizing a single material.

Another object of the present invention is to provide an improved photo coupler device which is molded by two layers having similar thermal properties.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a photo coupler device is provided which comprises only one layer of a resinous material containing addition particles and provided for molding as a pair of elements a light emitting element and a light receiving element. The addition particles can be silica particles in the crystal form or amorphous form, glass fiber and the like. The addition particles are suspended in the layer in a certain proportion equal to or below about 70% by weight in comparison with the weight of the resinous material. The diameter of the addition particles is in the range of about several tens to about one hundred μm. Preferably, the resinous material is made of an epoxy resin having a phenol as a hardener in the case where the light emitting element provides its electroluminescence in the infrared region.

In another form of the present invention, an additional layer also having another type of resinous material and addition particles can be formed to mold the first layer containing the pair of the elements.

BRIEF DESCRIPTION OF THE DRAWINGS

The present invention will become more fully understood from the detailed description given hereinbelow and accompanying drawings which are given by way of illustration only, and thus are not limitative of the present invention and wherein.

DESCRIPTION OF THE INVENTION

Figure 1:
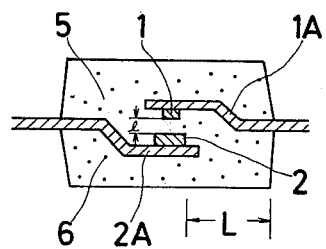
FIG. 1 is a sectional view of a form of photo coupler device according to the present invention.

With reference to FIG. 1, the photo coupler device of the present invention comprises a light emitting diode 1, a photo receiving element 2 such as a photo diode and a photo transistor etc., a pair of lead frames 1A and 2A, a resinous layer 5, and filler particles 6.

Each of the light emitting diode 1 and the photo receiving element 2 is bonded to the lead frames 1A and 2A with the aid of conducting paste etc. Upon the application of electrical energy, the light emitting diode 1 emits light which is applied to the light receiving element 2. Elements 1 and 2 are separated from each other by a spacing l. The resin layer 5 made of any type of ordinary resinous material is formed to mold the pair of elements, i.e., the light emitting diode 1 and the light receiving element 2 in relationship to each other but apart from the surroundings. Preferably, the resinous layer 5 has semipermeability to light. Transfer mold techniques using a metal pattern can be adopted to form the resin layer 5.

In the resin layer 5, filler particles 6 are additionally suspended. The diameter of the filler particles 6 used in the photo coupler device of the present invention is selected to be larger than that of the conventional filler particles used for the conventional photo coupler mold techniques. The diameter of the filler particles 6 is preferably in the range of about several tens to about one hundred μm. In addition, the filler particles 6 are held in suspension in the resin layer 5 in a larger amount than in the conventional case. They are added to the resin material preferably in a certain proportion up to about 70% by weight in comparison with weight of the resin material to form the resin layer 5.

A material suitable for the filler particles 6 is selected from silica in crystal form or in amorphous form, glass fiber, and the like.

Figure 2:
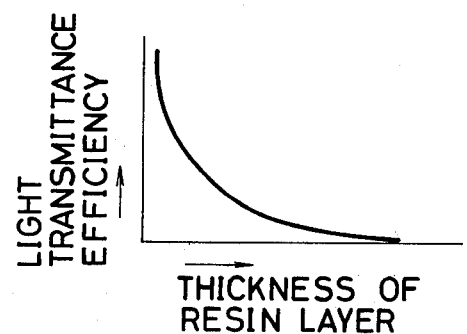
FIG. 2 shows a graph representing the relationship between the thickness of a layer and the light transmittance efficiency caused in the layer for use in the photo coupler device indicated in FIG. 1.

FIG. 2 shows a graph representing the relationship between the thickness of the resin layer 5 and the light transmittance efficiency. The graph indicates that the light transmittance efficiency in the resin layer 5 is remarkably reduced in accordance with an increase in its thickness.

In the photo coupler device of the present invention, however, the spacing l between the light emitting diode 1 and the light receiving element 2 is selected to be small relative to the thickness L of the resinous layer 5 separating the pair of the diode 1 and the element 2 from the surroundings, which is selected to be large. Therefore, the light emitted from the diode 1 is efficiently applied to the element 2, and the efficiency as a useful device is effectively maintained. External light from the surroundings is reflected or absorbed by the resin layer 5, so that the light receiving element 2 is not exposed to such external light.

It is not required, according to the present invention, to form an additional layer surrounding the resin layer 5. This simplifies the fabrication steps and enhances the dielectric breakdown voltage in the photo coupler device because of the unity of the resinous layer 5. By the addition of the filler particles 6 in a certain proportion and with a large diameter, the photo coupler device is increased in mechanical strength.

In the above mentioned preferred form of the present invention, each of the diode 1 and the element 2 is directly subjected to molding by the resinous material. Unlike this case, at least one of them can be covered by an additional resinous material which is transparent before the mold by the resin layer 5. Thereafter, both of them can be molded by the resin layer 5.

Furthermore, if desired, a dye material can be added to the resin layer 5, taking into account the wavelength of the electroluminescence emitted from the light emitting diode 1. The dye material should absorb the light of the wavelength except for that of the electroluminescence by the diode 1.

Figure 3:
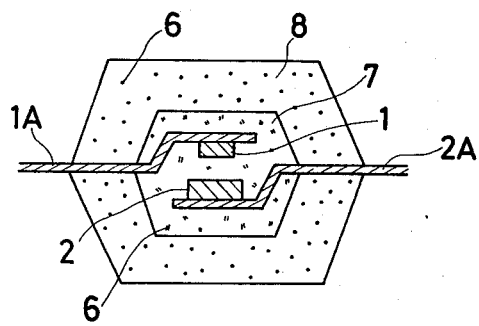
FIG. 3 is a sectional view of another form of the photo coupler device according to the present invention.

FIG. 3 is a cross-sectional view of another form of photo coupler device according to the present invention. Like elements corresponding to those of FIG. 1 are indicated by like numerals.

In this example, the light emitting diode 1 is composed of GaAs etc. for emitting the electroluminescence of infrared radiation. A first resinous layer 7 is provided to cause a transfer mold to the pair of the light emitting diode 1 and the light receiving element 2. The transfer mold is provided to mold the pair of elements 1 and 2 together using a desirable metal pattern. In the first resin layer 7, a considerable ratio of the filler particles 6 is suspended like in the photo coupler device shown in FIG. 1. A material suitable for the first resinous layer 7 is an epoxy resin having a phenol as a hardener.

A second resin layer 8 is additionally provided for causing the transfer mold to the unit by the first resinous layer 7. Like in the first resin layer 7, the filler particles 6 are held in suspension in the second resin layer 8. In addition, a dye material, e.g., carbon black etc. is added to the second resin layer 8 so that it becomes opaque.

Figure 4:
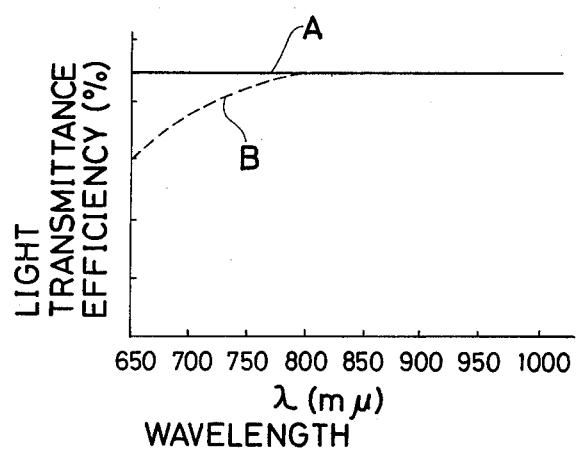
FIG. 4 shows a graph representing a comparison in light transmittance properties of a synthetic resin used in the device shown in FIG. 3 before and after being exposed to high temperature and high humidity.

An epoxy resin having a phenol as a hardener for use in the first resin layer 7 shows good resistance to humidity. FIG. 4 shows a graph representing the comparison in light transmittance properties of an epoxy resin having a phenol as a hardener before and after exposure to high temperature and high humidity. Data A are related to the condition before exposure while data B are related to the condition after exposure. The graph shows that the light transmittance efficiency is unchanged in the infrared radiation region, in which the light emitting diode 1 of GaAs has a peak with regard to the electroluminescence.

Like in the photo coupler device shown in FIG. 1, the pair of elements, i.e., the diode 1 and the element 2 is close enough to communicate with each other regardless of the addition of the filler particles 6 having a certain proportion and a large diameter. The pair of elements 1 and 2 is protected by the first and the second resin layers 7 and 8 from both heat and humidity.

Since the filler particles 6 are commonly suspended in the first and the second resin layers 7 and 8, the two layers 7 and 8 have similar properties in thermal expansion and humidity resistance, thus avoiding the generation of stress along their interface. By virtue of the introduction of the filler particles 6 into the first resin layer 7 containing the diode 1 and the element 2 in addition to the second resin layer 8, moisture even if absorbed into the two resin layers 7 and 8 is spread widely within them so that the occurrence of stress in the interface between them is prevented even in the exposure to a large degree of humidity, thus increasing mechanical strength.

By the addition of the filler particles 6 into the two layers 7 and 8, both of them can be formed by utilizing the transfer mold techniques by a metal pattern without any damage of the photo coupler device.

While only certain embodiments of the present invention have been described, it will be apparent to those skilled in the art that various changes and modifications may be made therein without departing from the spirit and scope of the invention as claimed.

What is claimed is:

1. A photo coupler device comprising:
   a light emitting element and a light receiving element disposed in opposing relationship with respect to each other, and
   a unitary layer of synthetic resinous material encapsulating the light emitting element and the light receiving element, said unitary layer containing a substantial amount of filler particles which are held in suspension within said layer in an amount up to about 70 percent by weight based on the weight of said layer, said filler particles having a particle size with a diameter in the range of about several tens to about one hundred μm,
   wherein the thickness of the synthetic resinous material between the light emitting element and the light receiving element is small relative to the thickness of the synthetic resinous material separating said elements from the environment, whereby the light transmitting efficiency between the two elements is effectively maintained while substantially eliminating the effects of ambient light upon said elements.

2. The device according to claim 1, wherein at least one of the light emitting element and the light receiving element is covered by a synthetic resinous material which is transparent inside the unitary layer.

3. The device according to claim 1, wherein the unitary layer is colored by the presence of a dye material.

4. The device according to claim 1, which further comprises:
   an additional layer of synthetic resinous material encapsulating the unitary layer, said additional layer containing a substantial amount of filler particles which are held in suspension within said layer in an amount up to about 70 percent by weight based on the weight of said layer, said filler particles having a particle size with a diameter in the range of about several tens to about one hundred μm.

5. The device according to claim 1, wherein the synthetic resinous material for the unitary layer is an epoxy resin having a phenol as a hardener.

6. The device according to claim 4, wherein the additional layer is made opaque by the addition of a dye material.

7. The device according to claim 5, wherein the light emitting element provides its electroluminescence having a peak in infrared regions upon the application of electric energy.

8. The device according to any one of claims 1 and 4, wherein the filler particles are selected from the group consisting of crystal form silica, amorphous form silica, and glass fiber.

9. The photo coupler of claim 4, wherein the synthetic resinous material for the additional layer is an epoxy resin having a phenol as a hardener.

10. The photo coupler of claim 1 having increased mechanical strength and substantially insulated from heat and humidity.

11. The photo coupler of claim 1, wherein the filler particles are uniformly distributed throughout the unitary layer.

12. The photo coupler of claim 4, wherein the filler particles are uniformly distributed throughout both the unitary layer and the additional layer.

13. A photo coupler device comprising:
- a light emitting element and a light receiving element disposed in opposing relationship with respect to each other, and
- a unitary layer of synthetic resinous material encapsulating the light emitting element and the light receiving element, said unitary layer containing a substantial amount of filler particles which are held in suspension within said layer,
- wherein the thickness of the synthetic resinous material between the light emitting element and the light receiving element is inversely proportional to the light transmittance efficiency of said unitary layer,
- wherein the thickness of the synthetic resinous material between the light emitting element and the light receiving element is small relative to the thickness of the synthetic resinous material separating said elements from the environment, whereby the light transmitting efficiency between the two elements is effectively maintained while substantially eliminating the effects of ambient light upon said elements.

14. The photo coupler device of claim 13 wherein the filler particles are present within said layer in an amount up to about 70 percent by weight based on the weight of said layer, said filler particles having a particle size with a diameter in the range of about several tens to about one hundred $\mu$m.

15. The photo coupler device of claim 14 which further comprises:
- an additional layer of synthetic resinous material encapsulating the unitary layer, said additional layer containing a substantial amount of filler particles which are held in suspension within said layer in an amount up to about 70 percent by weight based on the weight of said layer, said filler particles having a particle size with a diameter in the range of about several tens to about one hundred $\mu$m.

* * * * *